United States Patent
Wang et al.

(10) Patent No.: US 6,528,412 B1
(45) Date of Patent: Mar. 4, 2003

(54) DEPOSITING AN ADHESION SKIN LAYER AND A CONFORMAL SEED LAYER TO FILL AN INTERCONNECT OPENING

(75) Inventors: Pin-Chin C. Wang, Menlo Park, CA (US); Sergey Lopatin, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/844,727

(22) Filed: Apr. 30, 2001

(51) Int. Cl.$^7$ .......................................... H01L 21/4763
(52) U.S. Cl. ................. 438/628; 438/622; 438/624; 438/627; 438/637; 438/644; 438/687
(58) Field of Search ............................. 438/618, 622, 438/624, 626, 627, 628, 633, 637, 642, 643, 644, 652, 653, 654, 675, 680, 681, 648, 687; 257/751, 762

(56) References Cited

U.S. PATENT DOCUMENTS

| | | | | |
|---|---|---|---|---|
| 5,821,168 A | * | 10/1998 | Jain | 438/692 |
| 6,130,161 A | * | 10/2000 | Ashley et al. | 438/687 |
| 6,218,302 B1 | * | 4/2001 | Braeckelmann et al. | 438/687 |
| 6,242,349 B1 | * | 6/2001 | Nogami et al. | 438/687 |
| 6,315,883 B1 | * | 11/2001 | Mayer et al. | 205/123 |
| 6,181,012 B1 | * | 1/2002 | Edelstein et al. | 257/762 |
| 6,368,954 B1 | * | 4/2002 | Lopatin et al. | 438/627 |
| 6,368,966 B1 | * | 4/2002 | Krishnamoorthy et al. | 438/687 |

* cited by examiner

*Primary Examiner*—Amir Zarabian
*Assistant Examiner*—Maria Guerrero
(74) *Attorney, Agent, or Firm*—Monica H. Choi

(57) ABSTRACT

For filling an interconnect opening within an insulating layer on a semiconductor wafer, an adhesion skin layer is deposited conformally onto an underlying material comprised of one of a barrier material or a dielectric material at sidewalls and a bottom wall of the interconnect opening. The adhesion skin layer includes a metal alloy doping element. A conformal seed layer is deposited onto the adhesion skin layer using a conformal deposition process, such as an ECD (electrochemical deposition) or a CVD (chemical-vapor-deposition) process. The adhesion skin layer promotes adhesion of the conformal seed layer to the underlying material at the sidewalls and the bottom wall of the interconnect opening. The interconnect opening is filled with a conductive material grown from the conformal seed layer. In this manner, the adhesion skin layer promotes adhesion of the conformal seed layer to the underlying material to minimize electromigration failure of the interconnect. In addition, the seed layer formed by conventional PVD (physical-vapor-deposition) processes is avoided with the present invention. Instead, the relatively thin adhesion skin layer and the relatively thin conformal seed layer are used for plating the conductive fill. With such relatively thin layers, an interconnect opening having a high aspect ratio is filled with minimized void formation.

17 Claims, 8 Drawing Sheets

US 6,528,412 B1

DEPOSITING AN ADHESION SKIN LAYER AND A CONFORMAL SEED LAYER TO FILL AN INTERCONNECT OPENING

TECHNICAL FIELD

The present invention relates generally to fabrication of interconnect, such as copper interconnect for example, within an integrated circuit, and more particularly, to depositing an adhesion skin layer and a thin conformal seed layer for filling an interconnect opening to minimize electromigration and void formation within the interconnect.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Thus far, aluminum has been prevalently used for metallization within integrated circuits. However, as the width of metal lines are scaled down to smaller submicron and even nanometer dimensions, aluminum metallization shows electromigration failure. Electromigration failure, which may lead to open and extruded metal lines, is now a commonly recognized problem. Moreover, as dimensions of metal lines further decrease, metal line resistance increases substantially, and this increase in line resistance may adversely affect circuit performance.

Given the concerns of electromigration and line resistance with smaller metal lines and vias, copper is considered a more viable metal for smaller metallization dimensions. Copper has lower bulk resistivity and potentially higher electromigration tolerance than aluminum. Both the lower bulk resistivity and the higher electromigration tolerance improve circuit performance.

Referring to FIG. 1, a cross sectional view is shown of a copper interconnect 102 within a trench 104 formed in an insulating layer 106. The copper interconnect 102 within the insulating layer 106 is formed on a semiconductor wafer 108 such as a silicon substrate as part of an integrated circuit. Because copper is not a volatile metal, copper cannot be easily etched away in a deposition and etching process as typically used for aluminum metallization. Thus, the copper interconnect 102 is typically formed by etching the trench 104 as an opening within the insulating layer 106, and the trench 104 is then filled with copper typically by an electroplating process, as known to one of ordinary skill in the art of integrated circuit fabrication.

Unfortunately, copper is a mid-bandgap impurity in silicon and silicon dioxide. Thus, copper may diffuse easily into these common integrated circuit materials. Referring to FIG. 1, the insulating layer 106 may be comprised of silicon dioxide or a low dielectric constant insulating material such as organic doped silica, as known to one of ordinary skill in the art of integrated circuit fabrication. The low dielectric constant insulating material has a dielectric constant that is lower than that of pure silicon dioxide ($SiO_2$) for lower capacitance of the interconnect, as known to one of ordinary skill in the art of integrated circuit fabrication.

Copper may easily diffuse into such an insulating layer 106, and this diffusion of copper may degrade the performance of the integrated circuit. Thus, a diffusion barrier material 110 is deposited to surround the copper interconnect 102 within the insulating layer 106 on the sidewalls and the bottom wall of the copper interconnect 102, as known to one of ordinary skill in the art of integrated circuit fabrication. The diffusion barrier material 110 is disposed between the copper interconnect 102 and the insulating layer 106 for preventing diffusion of copper from the copper interconnect 102 to the insulating layer 106 to preserve the integrity of the insulating layer 106.

Further referring to FIG. 1, an encapsulating layer 112 is deposited as a passivation layer to encapsulate the copper interconnect 102, as known to one of ordinary skill in the art of integrated circuit fabrication. The encapsulating layer 112 is typically comprised of a dielectric such as silicon nitride, and copper from the copper interconnect 102 does not easily diffuse into such a dielectric of the encapsulating layer 112.

Referring to FIG. 2, typically for filling the trench 104 with copper, a diffusion barrier material 121 is deposited on the sidewalls and the bottom wall of the trench 104. The diffusion barrier material 121 is similar to the diffusion barrier material 110 of FIG. 1. A seed layer 122 of copper is deposited on the diffusion barrier material 121 at the sidewalls and the bottom wall of the trench 104, and then copper is electroplated from the seed layer 122 to fill the trench 104 in an ECD (electrochemical deposition) process, as known to one of ordinary skill in the art of integrated circuit fabrication. The seed layer 122 of copper is typically deposited by a PVD (plasma-vapor-deposition) process as known to one of ordinary skill in the art of integrated circuit fabrication. With such a deposition process, referring to FIG. 2, when the aspect ratio (defined as the depth to the width) of the trench 104 to be filled with copper is relatively large (i.e., greater than 5:1), the seed layer 122 that is deposited on the sidewalls and the bottom wall of the opening 104 may have a significant overhang 124 at the top corners of the interconnect opening 104.

Referring to FIGS. 2 and 3, when copper fill 126 is plated from the seed layer 122, the copper that is plated from the overhang 124 may close off the top of the interconnect opening 104 before a center portion of the interconnect opening 104 is filled with copper to result in formation of a void 128 within the copper fill 126 toward the center of the interconnect opening 104. Such a void 128 disadvantageously increases the resistance of the interconnect and may even contribute to electromigration failure of the interconnect.

Referring to FIG. 4, to minimize the overhang 124 at the top corners of the interconnect opening 104, the seed layer of copper 122 is deposited to be thinner. However, the deposition of the seed layer 122 is not perfectly conformal when the seed layer 122 is too thin (having a thickness of less than about 100 angstroms) when the conventional PVD (plasma-vapor-deposition) process for depositing the seed layer 122 is used. The seed layer 122 may be discontinuous and may not form at the sidewalls and the bottom corners of the interconnect opening 104. However, it is desired for the copper fill to be plated from substantially all surfaces of the interconnect opening 104 including substantially the whole surface of the sidewalls and the bottom corners of the interconnect opening 104 to prevent void formation. Nevertheless, a thinner seed layer 122 is also desired to avoid formation of the overhang 124 for the interconnect opening 104 having high aspect ratio.

Referring to FIG. 5, because the seed layer 122 is discontinuous when the seed layer 122 is too thin, a seed enhancement layer 130 is formed on the seed layer 122. The seed enhancement layer 130 is a thinner layer of copper (having a thickness of about 50 angstroms to about 500 angstroms). The seed enhancement layer 130 is formed by an ECD (electrochemical deposition) or a CVD (chemical-vapor-deposition) process instead of the conventional PVD (physical-vapor-deposition) process (for forming the seed layer 122) such that the seed enhancement layer 130 is conformal to continuously cover substantially all exposed surfaces within the interconnect opening 104. A copper fill 132 is then plated from the seed enhancement layer 130 and the seed layer 122.

However, because the seed enhancement layer 130 is formed by an ECD (electrochemical deposition) or a CVD (chemical-vapor-deposition) process instead of the conventional PVD (physical-vapor-deposition) process for forming the seed layer 122, the seed enhancement layer 130 does not adhere as well as the seed layer 122 to the underlying material of the diffusion barrier material 121 at the sidewalls and the bottom wall of the interconnect opening 104, as known to one of ordinary skill in the art of integrated circuit fabrication. The seed layer 122 which is formed by the conventional PVD (physical-vapor-deposition) process adheres better to the underlying material of the insulating layer 106 at the sidewalls and the bottom wall of the interconnect opening 104, as known to one of ordinary skill in the art of integrated circuit fabrication.

The poor adhesion of the seed enhancement layer 130 to the underlying material of the diffusion barrier material 121 at the sidewalls and the bottom wall of the interconnect opening 104 is more likely to result in disadvantageous electromigration failure of the interconnect. On the other hand, a relatively thick seed layer 122 has overhang 124 at the top corners of the interconnect opening having high aspect ratio which is more likely to result in disadvantageous void formation within the interconnect.

Thus, a mechanism is desired for filling an interconnect opening having high aspect ratio with minimized electromigration failure and minimized void formation.

SUMMARY OF THE INVENTION

Accordingly, in a general aspect of the present invention, for filling an interconnect opening having high aspect ratio, a thin adhesion skin layer including a metal alloy doping element is first deposited on the underlying material at the sidewalls and the bottom wall of the interconnect opening. A conformal seed layer such as the seed enhancement layer for example is deposited onto the thin adhesion skin layer, and the conductive fill is plated from the conformal seed layer.

In one aspect of the present invention, for filling an interconnect opening within an insulating layer on a semiconductor wafer, an adhesion skin layer is deposited conformally onto an underlying material comprised of one of a barrier material or a dielectric material at sidewalls and a bottom wall of the interconnect opening. The adhesion skin layer includes a metal alloy doping element. A conformal seed layer is deposited onto the adhesion skin layer using a conformal deposition process, such as an ECD (electrochemical deposition) or a CVD (chemical-vapor-deposition) process, for depositing a conformal seed layer. The adhesion skin layer promotes adhesion of the conformal seed layer to the underlying material at the sidewalls and the bottom wall of the interconnect opening. The interconnect opening is filled with a conductive material grown from the conformal seed layer.

The present invention may be used to particular advantage when the conductive material filling the interconnect opening is comprised of substantially pure copper and when the conformal seed layer is comprised of substantially pure copper having a thickness in a range of from about 50 angstroms to about 500 angstroms. In addition, the present invention may be used to particular advantage when the adhesion skin layer is comprised of one of substantially pure zirconium, substantially pure tin, substantially pure zinc, substantially pure indium, or a copper alloy including one of zirconium, tin, zinc or indium having a concentration in copper of from about 0.01 atomic percent to about 10 atomic percent. The adhesion skin layer has a thickness in a range of from about 3 angstroms to about 100 angstroms in one embodiment of the present invention.

When a low deposition temperature below about 25° Celsius is used for depositing the adhesion skin layer, a thinner but yet continuous adhesion skin layer may be achieved. In addition, the underlying material is bombarded with an inert ion plasma to achieve a thinner but yet continuous adhesion skin layer. Furthermore, a thermal anneal process is performed by heating the conformal seed layer and the adhesion skin layer to further enhance the adhesion of the conformal seed layer to the underlying material.

In this manner, the adhesion skin layer promotes adhesion of the conformal seed layer to the underlying material to minimize electromigration failure of the interconnect. In addition, the seed layer formed by conventional PVD (physical-vapor-deposition) processes is avoided with the present invention. Instead, the relatively thin adhesion skin layer (having a thickness of about 3–100 angstroms) and the relatively thin conformal seed layer (having a thickness of about 50–500 angstroms) are used for plating the conductive fill. With such relatively thin layers, an interconnect opening having a high aspect ratio is filled with minimized void formation.

These and other features and advantages of the present invention will be better understood by considering the following detailed description of the invention which is presented with the attached drawings.

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, 16, 17, 18, 19, 20, 21, 22, and 23 refer to elements having similar structure and function.

DETAILED DESCRIPTION

The present invention is described for formation of copper interconnect. However, the present invention may be practiced for minimizing electromigration failure and void formation with conductive fill of other types of interconnects, as would be apparent to one of ordinary skill in the art of integrated circuit fabrication from the description herein.

Figure 1:
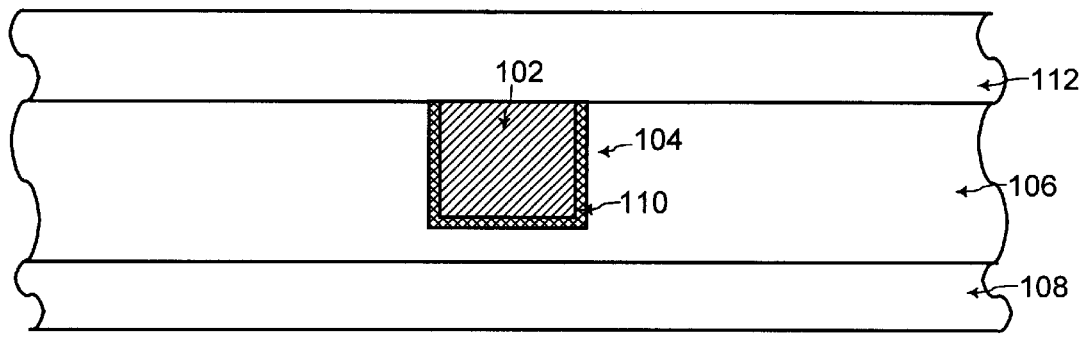
FIG. 1 shows a cross-sectional view of a copper interconnect formed by copper filling a trench within an insulating layer, according to the prior art.
Figure 2:
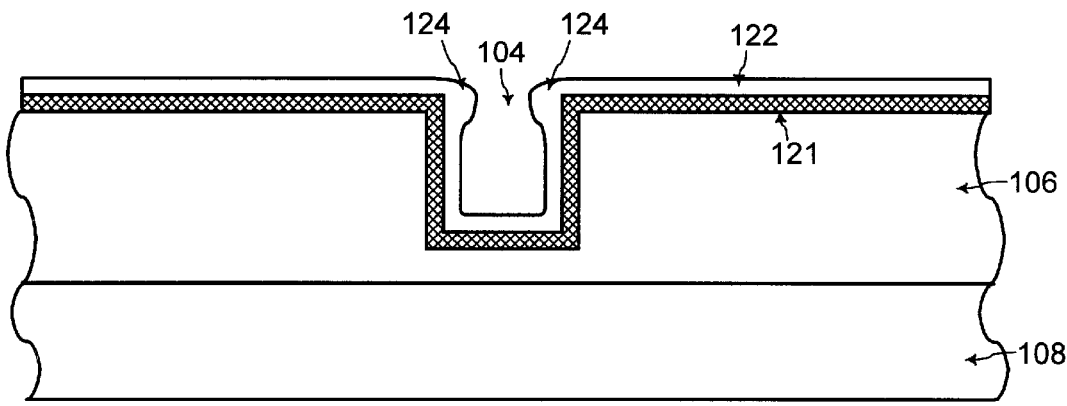
FIG. 2 shows a cross-sectional view of a seed layer of copper deposited on a diffusion barrier material at the sidewalls and the bottom wall of an interconnect opening for illustrating the formation of an overhang of the seed layer at the top corners of the interconnect opening when a relatively thick seed layer is deposited, according to the prior art.
Figure 3:
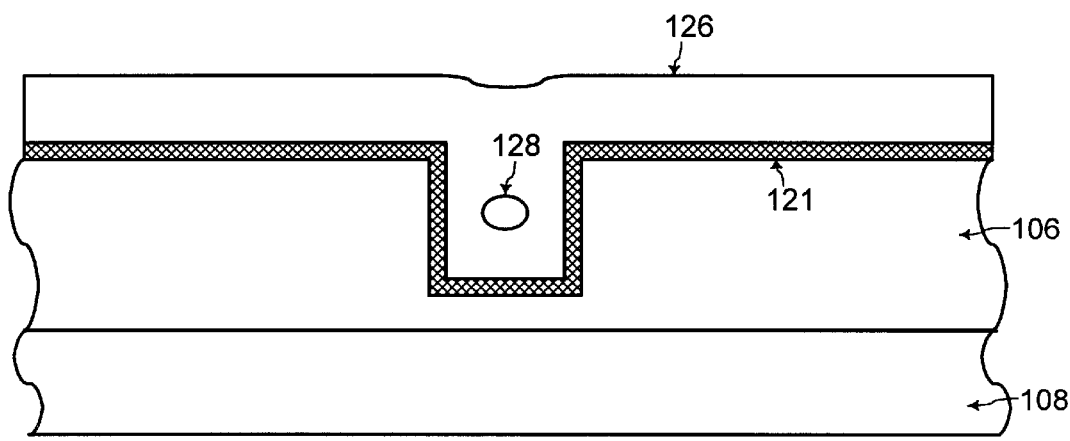
FIG. 3 shows a cross-sectional view of a copper fill plated from the seed layer of FIG. 2 for illustrating the formation of a void within the copper fill from the overhang of the seed layer of FIG. 2, according to the prior art.
Figure 4:
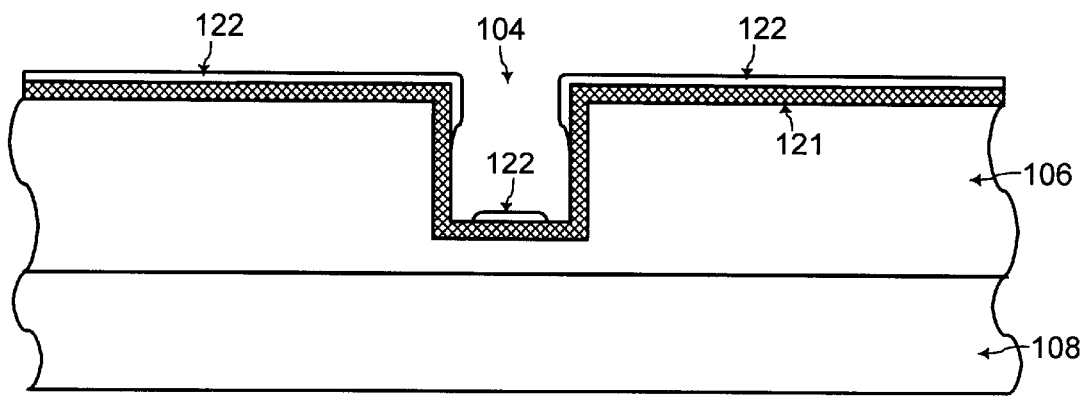
FIG. 4 shows a cross-sectional view of a relatively thin seed layer of copper deposited on the sidewalls and bottom wall of an interconnect opening for illustrating the discontinuity of the seed layer, according to the prior art.
Figure 5:
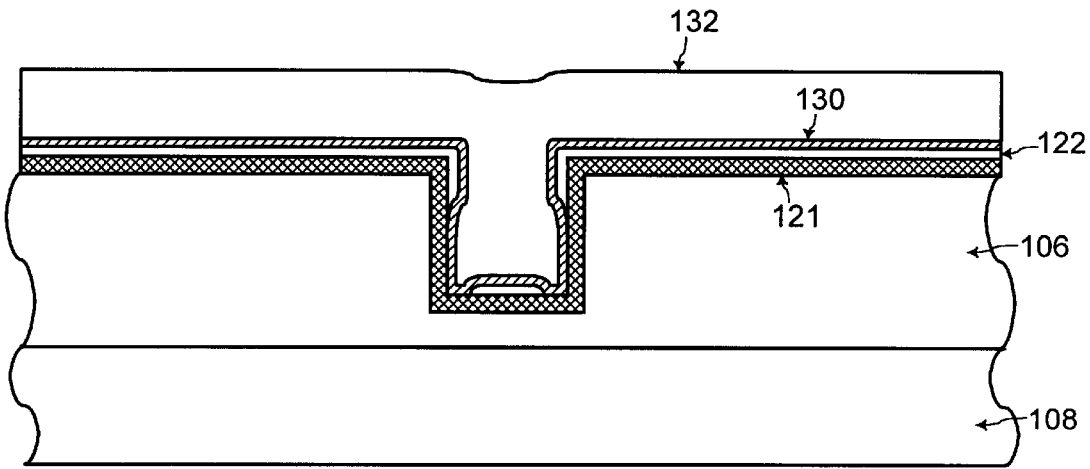
FIG. 5 shows a cross-sectional view of the relatively thin seed layer of copper of FIG. 4 with a conformal seed layer deposited on any exposed surfaces within the interconnect opening, according to the prior art.
Figure 6:
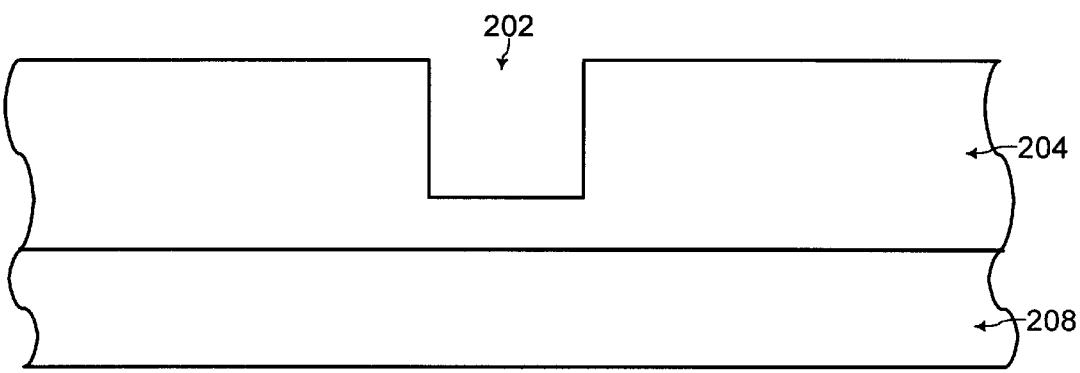
FIGS. 6, 7, 8, 9, 10, 11, 12, and 13 show cross-sectional views for formation of an interconnect to illustrate process steps for depositing an adhesion skin layer and a conformal seed layer onto a diffusion barrier material for plating the conductive fill of the interconnect, to minimize electromigration failure and void formation according to one embodiment of the present invention.

Referring to FIG. 6, for forming an interconnect such as copper interconnect, an interconnect opening 202 such as a trench line is formed within an insulating layer 204 on a semiconductor wafer 208 as part of an integrated circuit, as known to one of ordinary skill in the art of integrated circuit fabrication. Typically, the semiconductor wafer 208 is comprised of silicon (Si), and the insulating layer 204 is comprised of silicon dioxide ($SiO_2$) or a low dielectric constant insulating material such as organic doped silica, as known to one of ordinary skill in the art of integrated circuit fabrication.

Copper interconnect is desirable for metallization within an integrated circuit with scaled down dimensions because copper has lower bulk resistivity and potentially higher electromigration tolerance than aluminum. However, because copper is not a volatile metal, copper cannot be easily etched away in a deposition and etching process as typically used for aluminum metallization. Thus, copper interconnect is typically formed by etching the interconnect opening 202 within the insulating layer 204 and then filling the interconnect opening 202 with copper fill.

Figure 7:
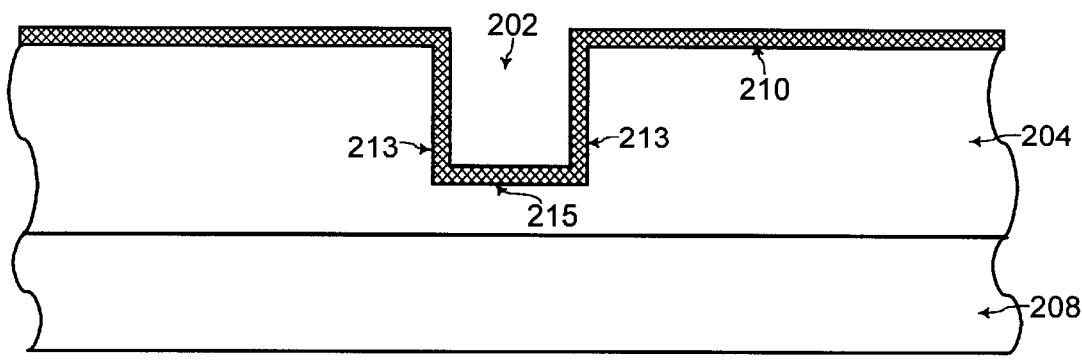

Referring to FIG. 7, a diffusion barrier material 210 is deposited on the exposed surfaces of the insulating layer 204 including the sidewalls 213 and the bottom wall 215 of the interconnect opening 202. The diffusion barrier material 210 prevents diffusion of copper to be filled within the interconnect opening 202 into the surrounding insulating layer 204. The diffusion barrier material 210 may be a diffusion barrier metal or a diffusion barrier dielectric. Such diffusion barrier materials and processes for deposition of such diffusion barrier materials are known to one of ordinary skill in the art of integrated circuit fabrication.

Unfortunately, copper is a mid-bandgap impurity in silicon and silicon dioxide. Thus, copper may diffuse easily into these common integrated circuit materials. Referring to FIG. 7, the insulating layer 204 is typically comprised of silicon dioxide or a low dielectric constant insulating material such as organic doped silica, as known to one of ordinary skill in the art of integrated circuit fabrication, especially when the semiconductor wafer 208 is a silicon substrate.

Copper may easily diffuse into the insulating layer 204, and this diffusion of copper may degrade the performance of the integrated circuit. Thus, the diffusion barrier material 210 is deposited to surround the copper to be filled within the interconnect opening 202. The diffusion barrier material 210 prevents diffusion of copper to filled within the interconnect opening 202 to the insulating layer 204 to preserve the integrity of the insulating layer 204.

Figure 8:
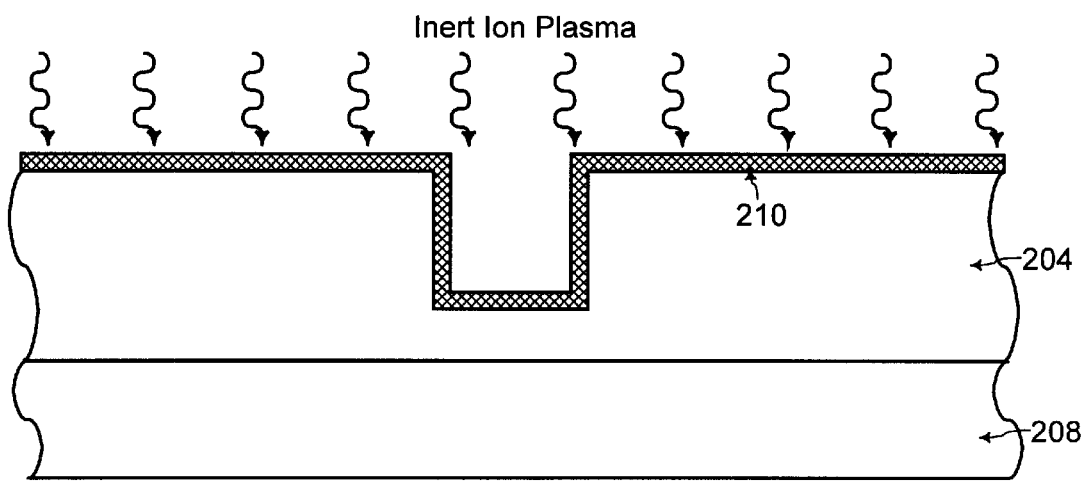

Referring to FIG. 8, exposed surfaces of the diffusion barrier material 210 are bombarded with an inert ion plasma in an isotropic plasma process (i.e., a plasma process using high process pressure of greater than about 10 milliTorr and a low voltage bias for an ion energy that is less than about 100 eV). The inert ion plasma is comprised of argon or helium, and preferably argon when the diffusion barrier material 210 is comprised of tantalum, titanium, tungsten, or these elements in a compound form with nitrogen, carbon, or silicon. Such plasma processes are known to one of ordinary skill in the art of integrated circuit fabrication. After the inert ion plasma bombards the exposed surfaces of the diffusion barrier material 210, the exposed surfaces of the diffusion barrier material 210 are roughened.

Figure 9:
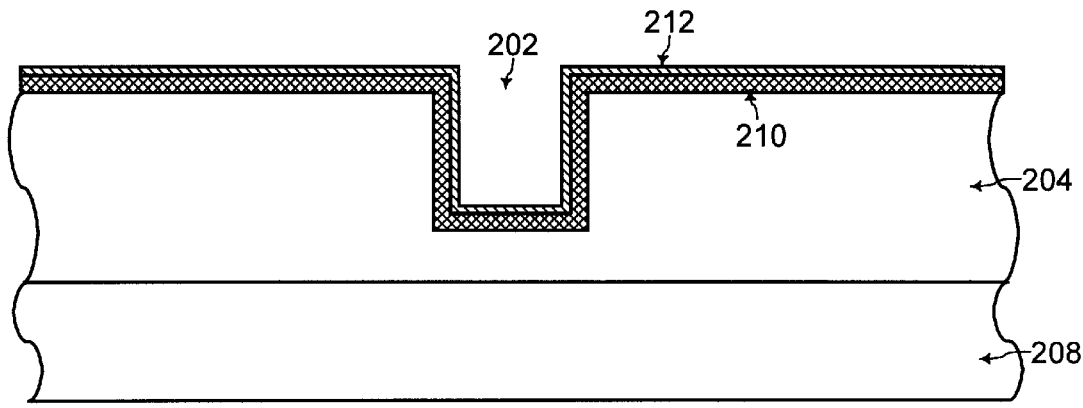

Referring to FIG. 9, an adhesion skin layer 212 is deposited onto the underlying material of the diffusion barrier material 210. The adhesion skin layer 212 includes a metal alloy doping element. In one embodiment of the present invention, the adhesion skin layer 212 is a copper alloy including the metal alloy doping element of zirconium, tin, zinc, or indium having a concentration in copper of from about 0.01 atomic percent to about 10 atomic percent. In another embodiment of the present invention, the adhesion skin layer 212 is comprised of the substantially pure metal alloy doping element such as substantially pure zirconium, substantially pure tin, substantially pure zinc, or substantially pure indium.

In either case, in one embodiment of the present invention, the adhesion skin layer 212 is relatively thin having a thickness in a range of from about 3 angstroms to about 100 angstroms. Referring to FIGS. 8 and 9, when the exposed surfaces of the diffusion barrier material 210 are roughened with bombardment by inert ion plasma, the adhesion skin layer 212 has a higher nucleation density to be thinner and yet substantially continuous. In addition, a relatively low deposition temperature of less than about 25° Celsius is used in a preferred embodiment of the present invention for forming the adhesion skin layer 212 with higher nucleation density such that the adhesion skin layer 212 may be thinner and yet substantially continuous. Such higher nucleation density results in smaller grain size within the adhesion skin layer 212 and thus in a smoother adhesion skin layer 212.

Processes, such as CVD (chemical-vapor-deposition) or ALD (atomic layer deposition) processes, which are conformal deposition processes, for forming the adhesion skin layer 212 comprised of substantially pure metal alloy doping element are known to one of ordinary skill in the art of integrated circuit fabrication. The patent application with Ser. No. 09/845,616 having title Formation of Alloy Material using Alternating Depositions of a Layer of Alloy Doping Element and a Layer of Bulk Material, and having the same inventors and filed concurrently herewith, describes a process for forming the adhesion skin layer 212 comprised of an alloy material such as copper alloy. This patent application with Ser. No. 09/845,616 is in its entirety incorporated herein by reference.

Figure 10:
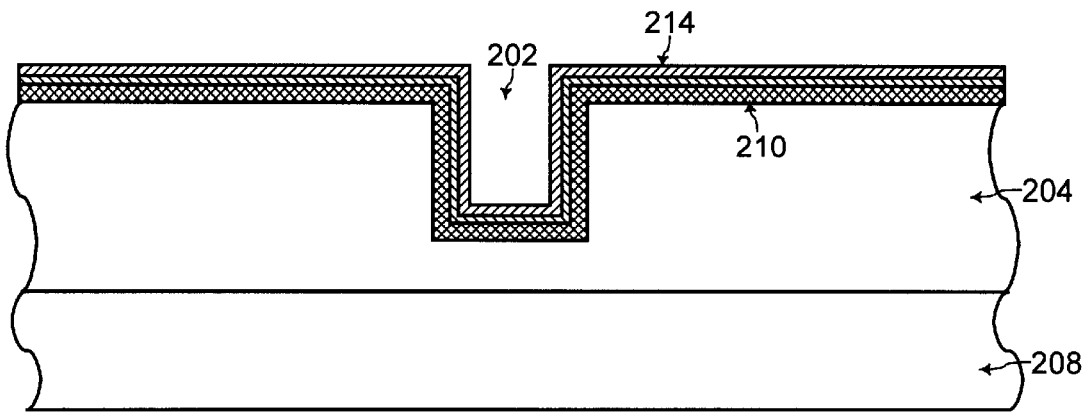

Referring to FIG. 10, a conformal seed layer 214 is deposited onto the adhesion skin layer 212 using a conformal deposition process. For example, the conformal seed layer 214 is deposited using a deposition process for depositing the seed enhancement layer 130 in FIG. 5. In one embodiment of the present invention, the conformal seed layer 214 is comprised of substantially pure copper having a thickness in a range of from about 50 angstroms to about 500 angstroms. Processes, such as ECD (electrochemical deposition) processes and CVD (chemical-vapor-deposition) processes, for depositing such a thin conformal seed layer 214 are different from processes, such as conventional PVD (physical-vapor-deposition) processes, for depositing the thicker seed layer 122 of FIGS. 2, 4, and 5 of the prior art, as known to one of ordinary skill in the art of integrated circuit fabrication.

The adhesion skin layer 212 having the metal alloy doping element promotes adhesion between the conformal seed layer 214 and the diffusion barrier material 210. In one embodiment of the present invention, after deposition of the conformal seed layer 214 on the adhesion skin layer 212, a thermal anneal is performed by heating the conformal seed layer 214 and the adhesion skin layer 212 at a temperature of from about 100° Celsius to about 400° Celsius for a time period of from about 2 seconds to about 60 minutes. Such a thermal anneal process further promotes adhesion between the conformal seed layer 214 and the diffusion barrier material 210 by the adhesion skin layer 212 having the metal alloy doping element.

Figure 11:
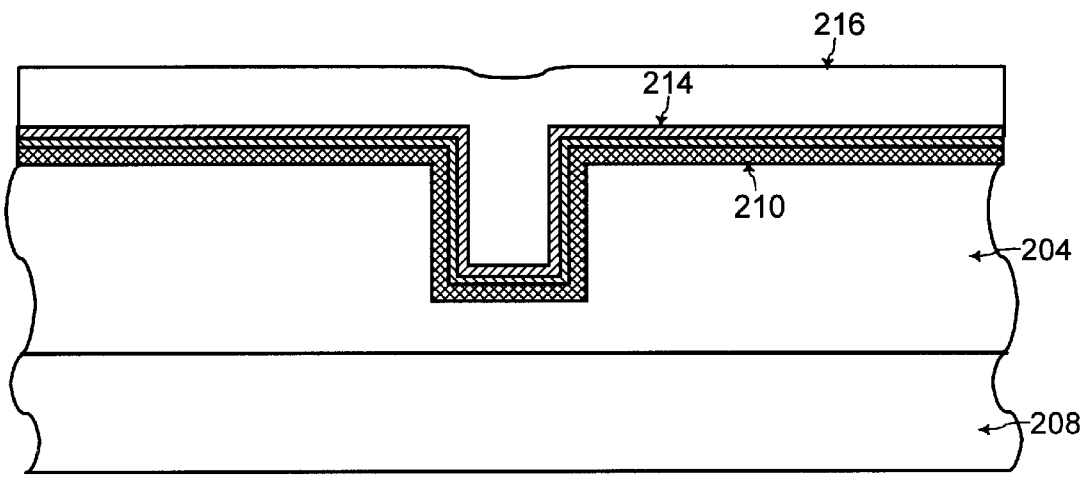

Referring to FIG. 11, the interconnect opening 202 is filled with a conductive material 216 grown from the conformal seed layer 214. For example, when the conformal seed layer 214 is comprised of substantially pure copper, the conductive material 216 is comprised of substantially pure copper electroplated from the conformal seed layer 214, according to one embodiment of the present invention. Electroplating processes for filling the interconnect opening 202 with copper 216 grown from the conformal seed layer 214 are known to one of ordinary skill in the art of integrated circuit fabrication.

Figure 12:
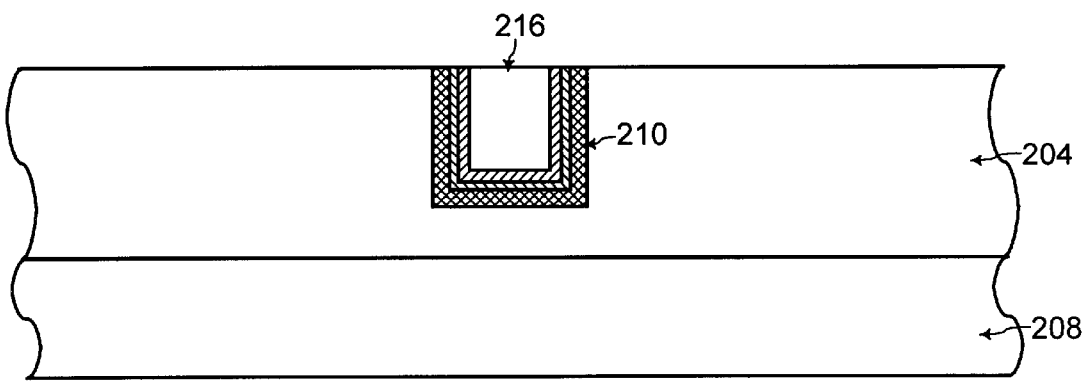

Referring to FIG. 12, any of the conductive material 216, the conformal seed layer 214, and the adhesion skin layer 212 on the insulating layer 204 surrounding the interconnect opening 202 is polished away to expose the insulating layer 204 such that the interconnect is contained within the interconnect opening 202. Processes, such as CMP (chemical mechanical polishing) processes are known to one of ordinary skill in the art of integrated circuit fabrication.

Figure 13:
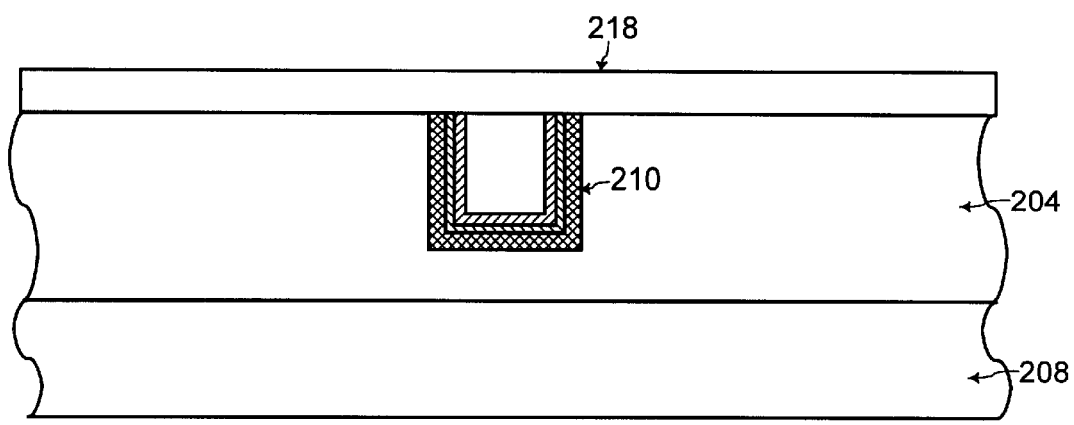

Referring to FIG. 13, a layer of bulk passivation material 218 is deposited on the insulating layer 204 and on top of the interconnect within the interconnect opening 202. The bulk passivation material 218 may be comprised of one of silicon oxynitride (SiON), silicon nitride (SiN), and a silicon carbide (SiC) film doped with hydrogen, and copper does not easily diffuse through such a bulk passivation material 218. Processes for depositing such bulk passivation material 218 are known to one of ordinary skill in the art of integrated circuit fabrication.

In this manner, the adhesion skin layer 212 promotes adhesion between the conformal seed layer 214 and the underlying diffusion barrier material 210 to minimize electromigration failure of the interconnect. In addition, the prior art seed layer formed by conventional PVD (physical-vapor-deposition) processes is avoided with the present invention. Instead, the relatively thin adhesion skin layer 212 (having a thickness of about 3–100 angstroms) and the relatively thin conformal seed layer 214 (having a thickness of about 50–500 angstroms) are used for plating the conductive material 216. With such relatively thin layers 212 and 214, an interconnect opening having high aspect ratio is filled with minimized void formation.

Figure 14:
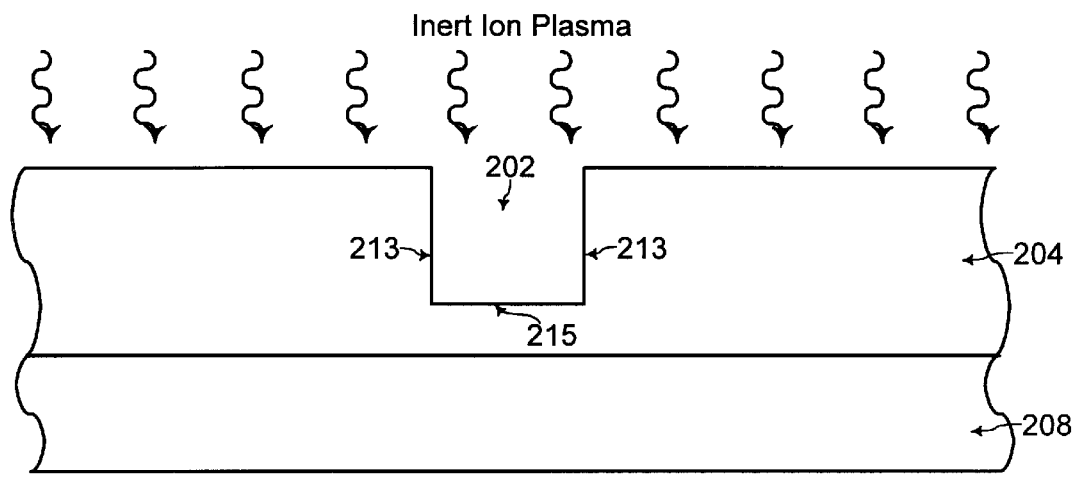
FIGS. 14, 15, 16, 17, and 18 show cross-sectional views for formation of an interconnect to illustrate process steps for depositing an adhesion skin layer and a conformal seed layer onto an insulating material of the insulating layer for plating the conductive fill of the interconnect, to minimize electromigration failure and void formation according to another embodiment of the present invention.

Referring to FIG. 14, in an alternative embodiment of the present invention, the adhesion skin layer and the conformal seed layer are formed on the dielectric material of the insulating layer 204 when a diffusion barrier material is not used. For example, with advancement of technology for dielectric material, the insulating layer 204 may be comprised of an insulating material that is impervious to copper diffusion such that a diffusion barrier material is not used. Alternatively, the insulating material 204 may be comprised of silicon dioxide or a low dielectric constant insulating material such as organic doped silica.

Referring to FIG. 14, exposed surfaces of the insulating layer 204 are bombarded with an inert ion plasma in an isotropic plasma process (i.e., a plasma process using high process pressure of greater than about 10 milliTorr and a low voltage bias for an ion energy that is less than about 100 eV). The inert ion plasma is comprised of argon or helium, and preferably helium for the insulating material of the insulating layer 204. Such plasma processes are known to one of ordinary skill in the art of integrated circuit fabrication. After the inert ion plasma bombards the exposed surfaces of the insulating layer 204, the exposed surfaces of the insulating layer 204 including the sidewalls 213 and the bottom wall 215 are roughened.

Figure 15:
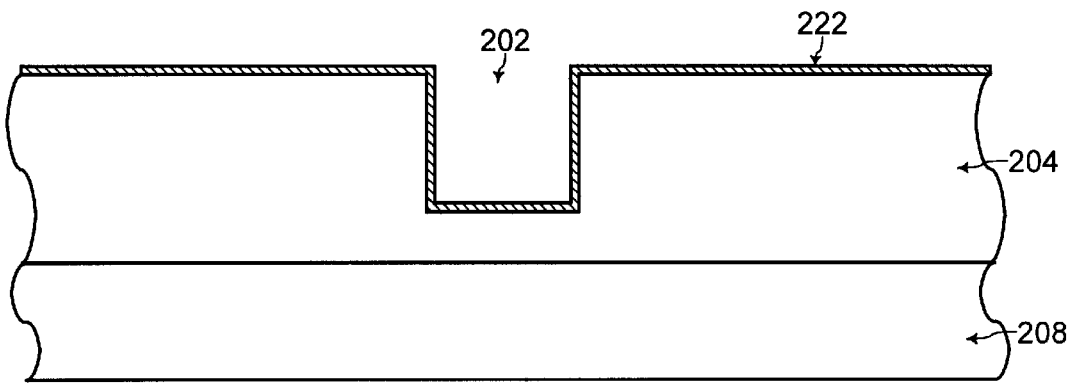

Referring to FIG. 15, an adhesion skin layer 222, similar to the adhesion skin layer 212 of FIG. 9, is conformally deposited onto the underlying material of the insulating layer 204. The adhesion skin layer 222 includes a metal alloy doping element. In one embodiment of the present invention, the adhesion skin layer 222 is a copper alloy including the metal alloy doping element of zirconium, tin, zinc, or indium having a concentration in copper of from about 0.01 atomic percent to about 10 atomic percent. In another embodiment of the present invention, the adhesion skin layer 222 is comprised of the substantially pure metal alloy doping element such as substantially pure zirconium, substantially pure tin, substantially pure zinc, or substantially pure indium.

In either case, in one embodiment of the present invention, the adhesion skin layer 222 is relatively thin having a thickness in a range of from about 3 angstroms to about 100 angstroms. Referring to FIGS. 14 and 15, when the exposed surfaces of the insulating layer 204 are roughened with bombardment by inert ion plasma, the adhesion skin layer 222 may be thinner and yet substantially continuous. In addition, a relatively low deposition temperature of less than about 25° Celsius is used in a preferred embodiment of the present invention for forming the adhesion skin layer 222 with higher nucleation density such that the adhesion skin layer 222 may be thinner and yet substantially continuous.

Processes, such as CVD (chemical-vapor-deposition) or ALD (atomic layer deposition) processes, which are conformal deposition processes, for forming the adhesion skin layer 222 comprised of substantially pure metal alloy doping element are known to one of ordinary skill in the art of integrated circuit fabrication. The patent application with Ser. No. 09/845,616 having title Formation of Alloy Material using Alternating Depositions of a Layer of Alloy Doping Element and a Layer of Bulk Material, and having the same inventors and filed concurrently herewith, describes a process for forming the adhesion skin layer 222 comprised of an alloy material such as copper alloy. This patent application with Serial No. 09/845,616 is in its entirety incorporated herein by reference.

Figure 16:
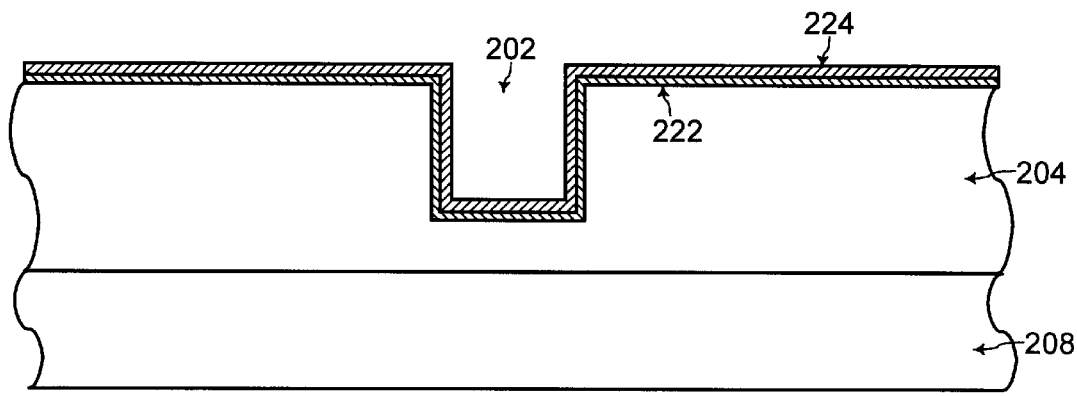

Referring to FIG. 16, a conformal seed layer 224 is deposited onto the adhesion skin layer 222 using a conformal deposition process. For example, the conformal seed layer 224 is deposited using a deposition process for depositing the seed enhancement layer 130 in FIG. 5. In one embodiment of the present invention, the conformal seed layer 224 is comprised of substantially pure copper having a thickness in a range of from about 50 angstroms to about 500 angstroms. Processes, such as ECD (electrochemical deposition) processes and CVD (chemical-vapor-deposition) processes, for depositing such a thin conformal seed layer 224 are different from processes, such as conventional PVD (physical-vapor-deposition) processes, for depositing the thicker seed layer 122 of FIGS. 2, 4, and 5 of the prior art, as known to one of ordinary skill in the art of integrated circuit fabrication.

The adhesion skin layer 222 having the metal alloy doping element promotes adhesion between the conformal seed layer 224 and the insulating layer 204. In one embodiment of the present invention, after deposition of the conformal seed layer 224 on the adhesion skin layer 222, a thermal anneal is performed by heating the conformal seed layer 224 and the adhesion skin layer 222 at a temperature of from about 100° Celsius to about 400° Celsius for a time period of from about 2 seconds to about 60 minutes. Such a thermal anneal process further promotes adhesion between the conformal seed layer 224 and the insulating layer 204 by the adhesion skin layer 222 having the metal alloy doping element.

Figure 17:
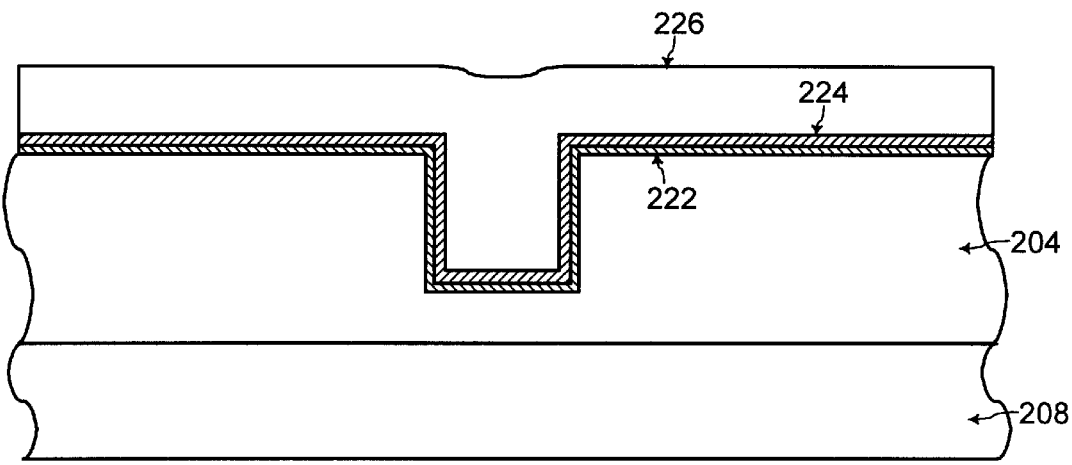

Referring to FIG. 17, the interconnect opening 202 is filled with a conductive material 226 grown from the conformal seed layer 224. For example, when the conformal seed layer 224 is comprised of substantially pure copper, the conductive material 226 is comprised of substantially pure copper electroplated from the conformal seed layer 224, according to one embodiment of the present invention. Electroplating processes for filling the interconnect opening 202 with copper 226 grown from the conformal seed layer 224 are known to one of ordinary skill in the art of integrated circuit fabrication.

Figure 18:
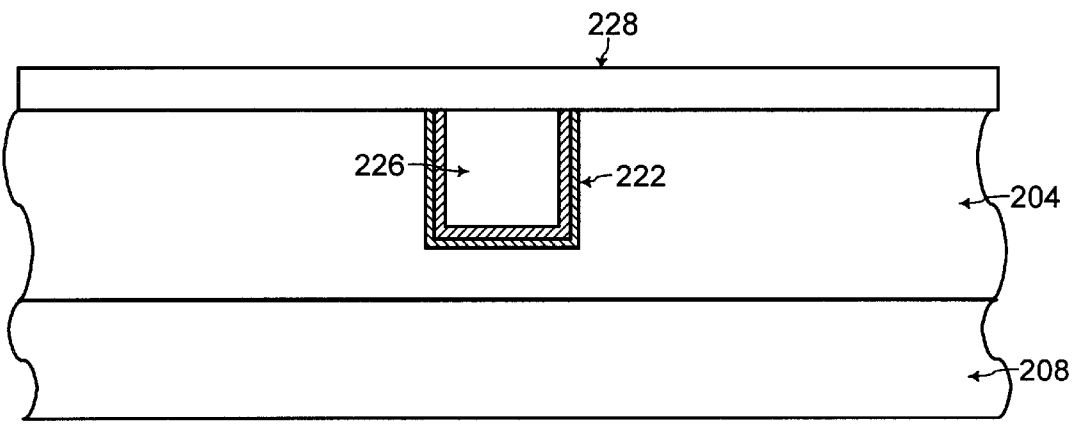

Referring to FIG. 18, any of the conductive material 226, the conformal seed layer 224, and the adhesion skin layer 222 on the insulating layer 204 surrounding the interconnect opening 202 is polished away to expose the insulating layer 204 such that the interconnect is contained within the interconnect opening 202. Processes, such as CMP (chemical mechanical polishing) processes are known to one of ordinary skill in the art of integrated circuit fabrication.

Further referring to FIG. 18, a layer of bulk passivation material 228 is deposited on the insulating layer 204 and on top of the interconnect within the interconnect opening 202. The bulk passivation material 228 may be comprised of one of silicon oxynitride (SiON), silicon nitride (SiN), and a silicon carbide (SiC) film doped with hydrogen, and copper does not easily diffuse through such a bulk passivation material 228. Processes for depositing such bulk passivation material 228 are known to one of ordinary skill in the art of integrated circuit fabrication.

In this manner, the adhesion skin layer 222 promotes adhesion between the conformal seed layer 224 to the underlying insulating material of the insulating layer 204 to minimize electromigration failure of the interconnect. In addition, the prior art seed layer formed by conventional PVD (physical-vapor-deposition) processes is avoided with the present invention. Instead, the relatively thin adhesion skin layer 222 (having a thickness of about 3–100 angstroms) and the relatively thin conformal seed layer 224 (having a thickness of about 50–500 angstroms) are used for plating the conductive material 226. With such relatively thin layers 222 and 224, an interconnect opening having a high aspect ratio is filled with minimized void formation.

Figure 19:
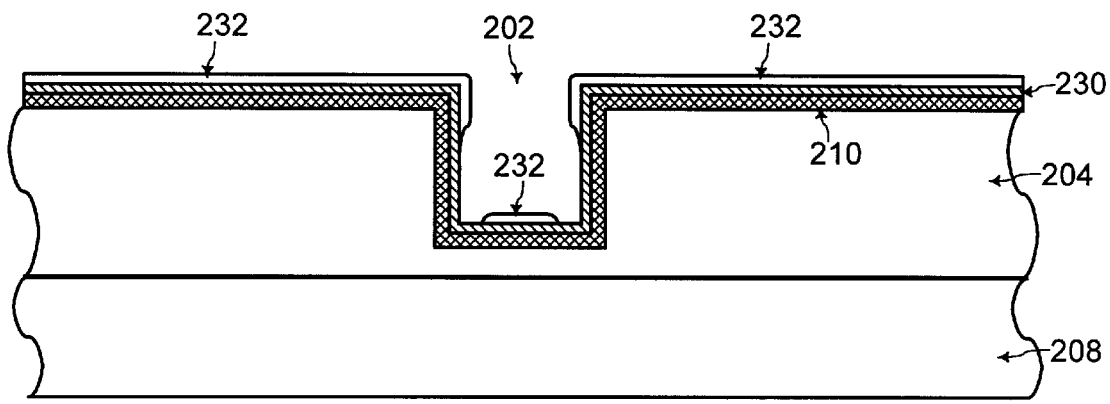
FIGS. 19 and 20 show cross-sectional views for formation of an interconnect to illustrate process steps for depositing a non-conformal seed layer between the adhesion skin layer and the conformal seed layer, according to a further embodiment of the present invention.

Referring to FIG. 19, in a further embodiment of the present invention, an adhesion skin layer 230 is deposited on the underlying diffusion barrier material 210, and a non-conformal seed layer 232 is deposited on the adhesion skin layer 230. The adhesion skin layer 230 is similar to the adhesion skin layer 212 of FIG. 6 or 222 of FIG. 15, as described herein. The non-conformal seed layer 232 is similar to the non-conformal seed layer 122 of FIG. 4 as described herein and is relatively thin (having a thickness of less than about 100 angstroms). Similar to the non-conformal seed layer 122 of FIG. 4, the non-conformal seed layer 232 of FIG. 19 is deposited by a non-conformal deposition process such as a PVD (plasma-vapor-deposition) process.

Figure 20:
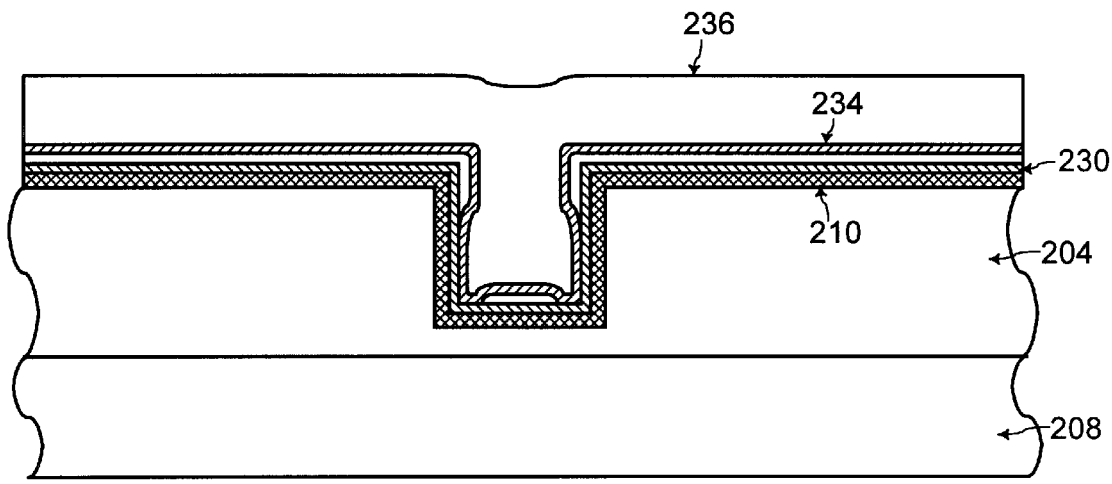

Referring to FIG. 20, a conformal seed layer 234 is deposited on the non-conformal seed layer 232 and on portions of the adhesion skin layer 230 not having the non-conformal seed layer 232 deposited thereon. The conformal seed layer 234 is similar to the conformal seed layer 214 of FIG. 10 or 224 of FIG. 16, as described herein. Further referring to FIG. 20, a conductive material 236 is plated from the conformal seed layer 234. The conductive material 236 is similar to the conductive material 216 of FIG. 11 or 226 of FIG. 17, as described herein. This embodiment of depositing the non-conformal seed layer 232 between the adhesion skin layer 230 and the conformal seed layer 234 may also be practiced when the underlying material is the dielectric material of the insulating layer 204, as would be apparent to one of ordinary skill in the art of integrated circuit fabrication from the description herein.

Figure 21:
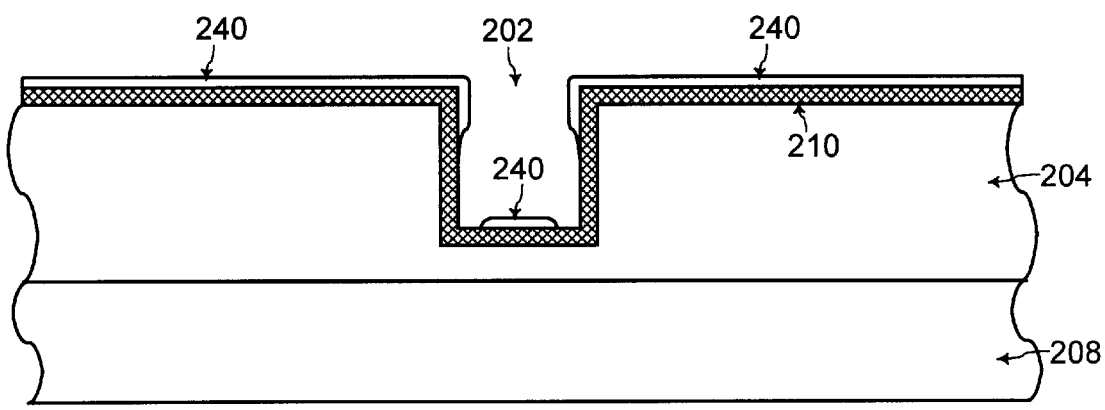
FIGS. 21, 22, and 23 show cross-sectional views for formation of an interconnect to illustrate process steps for depositing a non-conformal seed layer before depositing the adhesion skin layer and the conformal seed layer, according to another embodiment of the present invention.

Referring to FIG. 21, in another embodiment of the present invention, a non-conformal seed layer 240 is initially deposited on the underlying diffusion barrier material 210. The non-conformal seed layer 240 is similar to the non-conformal seed layer 122 of FIG. 4 as described herein and is relatively thin (having a thickness of less than about 100 angstroms). Similar to the non-conformal seed layer 122 of FIG. 4, the non-conformal seed layer 232 of FIG. 21 is deposited by a non-conformal deposition process such as a PVD (plasma-vapor-deposition) process.

Figure 22:
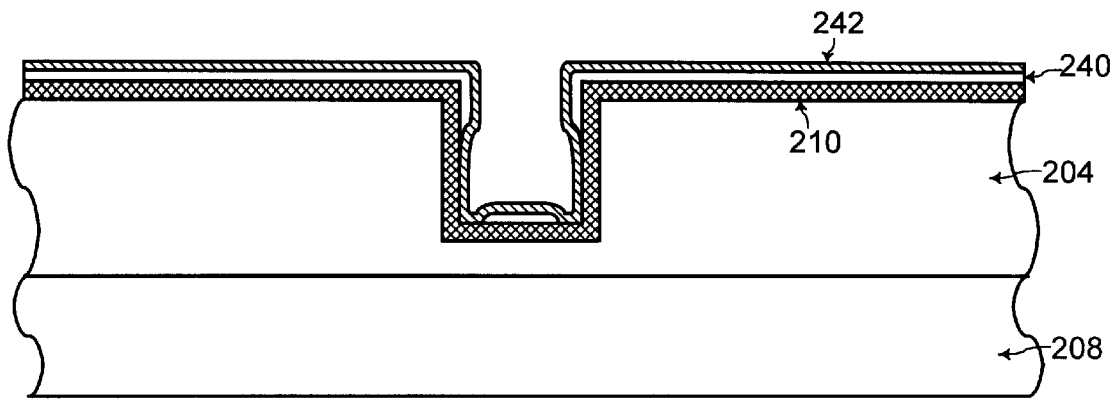
Figure 23:
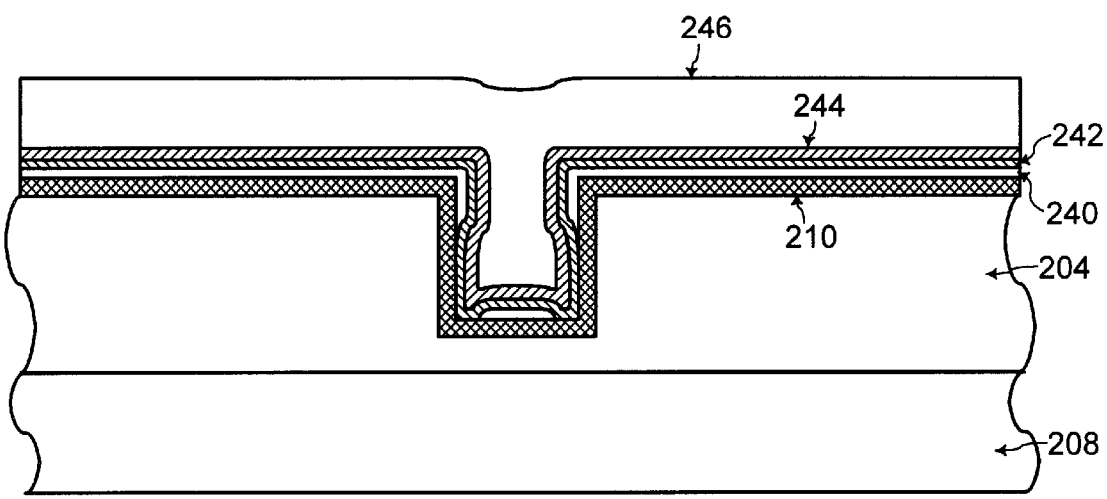

Referring to FIG. 22, an adhesion skin layer 242 is deposited on the non-conformal seed layer 240 and on portions of the underlying diffusion barrier material 210 not having the non-conformal seed layer 240 deposited thereon. The adhesion skin layer 242 is similar to the adhesion skin layer 212 of FIG. 6 or 222 of FIG. 15, as described herein. Referring to FIG. 23, a conformal seed layer 244 is deposited on the adhesion skin layer 242. The conformal seed layer 244 is similar to the conformal seed layer 214 of FIG. 10 or 224 of FIG. 16, as described herein. Further referring to FIG. 23, a conductive material 246 is plated from the conformal seed layer 244. The conductive material 246 is similar to the conductive material 216 of FIG. 11 or 226 of FIG. 17, as described herein. This embodiment of depositing the non-conformal seed layer 232 before depositing the adhesion skin layer 230 and the conformal seed layer 234 may also be practiced when the underlying material is the dielectric material of the insulating layer 204, as would be apparent to one of ordinary skill in the art of integrated circuit fabrication from the description herein.

The foregoing is by way of example only and is not intended to be limiting. For example, the present invention is described for formation of copper interconnect. However, the present invention may be practiced for minimizing electromigration failure and void formation within conductive fill of other types of interconnects, as would be apparent to one of ordinary skill in the art of integrated circuit fabrication from the description herein. Any materials or dimensions specified herein are by way of example only. In addition, the present invention may be practiced with the adhesion skin layer 222 being conformal or not conformal and with the adhesion skin layer 222 being continuous or not continuous, as would be apparent to one of ordinary skill in the art of integrated circuit fabrication from the description herein. On the other hand, the conformal skin layer 214 or 224 is deposited in a conformal deposition process.

Furthermore, as will be understood by those skilled in the art, the structures described herein may be made or used in the same way regardless of their position and orientation. Accordingly, it is to be understood that terms and phrases such as "top," "bottom," and "sidewall" as used herein refer to relative location and orientation of various portions of the structures with respect to one another, and are not intended to suggest that any particular absolute orientation with respect to external objects is necessary or required. The present invention is limited only as defined in the following claims and equivalents thereof.

We claim:

1. A method for filling an interconnect opening of an integrated circuit, said interconnect opening being with an insulating layer on a semiconductor wafer, the method including the steps of:
   A. depositing an adhesion skin layer onto an underlying comprised of one of a barrier material or a dielectric at sidewalls and a bottom wall of said interconnect opening, wherein said adhesion skin layer includes a metal allow doping element;
   B. depositing a conformal seed layer onto said adhesion skin layer using conformal deposition process;
   wherein said conformal seed layer is comprised of a pure bulk element, and wherein said adhesion skin layer is an alloy comprised of said metal allow doping element and said pure bulk element also comprising said conformal seed layer with said metal allow doping element doping said pure bulk element within said adhesion skin layer;
   and wherein said adhesion skin layer promotes adhesion of said conformal seed layer to said underlying material at said sidewalls and said bottom wall of said interconnect opening; and
   C. filling said interconnect opening with a conductive material grown from said conformal seed layer that is comprised of said pure bulk element.

2. The method of claim 1, further including the step of:
   depositing a layer of non-conformal seed layer on portions of said adhesion skin layer, after said step A and before said step B;
   wherein said conformal seed layer deposited in said step B is deposited on said non-conformal seed layer and on exposed portions of said adhesion skin layer not having said non-conformal seed layer deposited thereon.

3. The method of claim 1, further including the step of:
   depositing a layer of non-conformal seed layer on portions of said underlying material, before said step A;
   wherein said adhesion skin layer deposited in said step A is deposited on said non-conformal seed layer and on exposed portions of said underlying material not having said non-conformal seed layer deposited thereon.

4. The method of claim 1, wherein said adhesion skin layer is deposited using a conformal deposition process.

5. The method of claim 1, wherein said underlying material at said sidewalls and said bottom wall of said interconnect opening is a diffusion barrier material.

6. The method of claim 1, wherein said underlying material at said sidewalls and said bottom wall of said interconnect opening is an insulating material of said insulating layer that is comprised of a low dielectric constant material having a dielectric constant that is lower than silicon dioxide ($SiO_2$).

7. The method of claim 1, further including the step of:
   performing a thermal anneal after said step B and before said step C by heating said conformal seed layer and said adhesion skin layer at a temperature of from about 100° Celsius to about 400° Celsius for a time period of from about 2 seconds to about 60 minutes.

8. The method of claim 1, further including the step of:
   bombarding said underlying material at said sidewalls and said bottom wall of said interconnect opening with inert ion plasma, before said step A.

9. The method of claim 1, further including the steps of:
   polishing away any of said conductive material, said conformal seed layer, and said adhesion skin layer on said insulating layer surrounding said interconnect opening to expose said insulating layer such that said conductive material is contained within said interconnect opening; and
   depositing a layer of bulk passivation material on said insulating layer and on top of said filled interconnect opening to encapsulate said interconnect opening.

10. The method of claim 1, wherein said conductive material filling said interconnect opening in said step C is comprised of substantially pure copper.

11. The method of claim 10, wherein said conformal seed layer is comprised of substantially pure copper having a thickness in a range of from about 50 angstroms to about 500 angstroms.

12. The method of claim 11, wherein said conformal seed layer is deposited using one of an electro-chemical plating process or a CVD (chemical-vapor-deposition) process.

13. The method of claim 11, wherein said adhesion skin layer is comprised of a copper alloy including said metal alloy doping element comprising one of zirconium, tin, zinc, or indium having a concentration in copper of from about 0.01 atomic percent to about 10 atomic percent.

14. The method of claim 13, wherein said adhesion skin layer has a thickness in a range of from about 3 angstroms to about 100 angstroms.

15. The method of claim 14, wherein said adhesion skin layer is deposited by one of a CVD (chemical-vapor-deposition) process or an ALD (atomic layer deposition) process.

16. The method of claim 15, wherein said adhesion skin layer is deposited using a deposition temperature below about 25° Celsius.

17. A method for filling an interconnect opening of an integrated circuit with copper, said interconnect opening being within an insulating layer on a semiconductor wafer, the method including the sequential steps of:

A. bombarding an underlying material at sidewalls and a bottom wall of said interconnect opening with inert ion plasma formed from one of argon or helium; wherein said underlying material is comprised of one a diffusion barrier material deposited on said sidewalls and said bottom wall of said interconnect opening or an insulating material of said insulating layer that is comprised of a low dielectric constant material having a dielectric constant that is lower than silicon dioxide ($SiO_2$) when a barrier layer is not deposited on said sidewalls and said bottom wall of said interconnect opening;

B. depositing conformally an adhesion skin layer onto said underlying material at said sidewalls and said bottom wall of said interconnect opening;

wherein said adhesion skin layer is comprised of a copper alloy including one of zirconium, tin, zinc or indium having a concentration in copper of from about 0.01 atomic percent to about 10 atomic percent, said adhesion skin layer having a thickness in a range of from about 3 angstroms to about 100 angstroms;

and wherein said adhesion skin layer is deposited by one of a CVD (chemical-vapor-deposition) process or an ALD (atomic layer deposition) process, using a deposition temperature below about 25° Celsius;

C. depositing a conformal seed layer onto said adhesion skin layer using a conformal deposition process;

wherein said adhesion skin layer promotes adhesion of said conformal seed layer to said underlying material at said sidewalls and said bottom wall of said interconnect opening;

wherein said conformal seed layer is comprised of a pure bulk element, and wherein said adhesion skin layer is an alloy comprised of said metal alloy doping element and said pure bulk element also comprising said conformal seed layer with said metal alloy doping element doping said pure bulk element within said adhesion skin layer, and wherein said conformal seed layer is comprised of substantially pure copper having a thickness in a range of from about 50 angstroms to about 500 angstroms;

and wherein said conformal seed layer is deposited using one of an electro-chemical plating process or a CVD (chemical-vapor-deposition) process;

D. performing a thermal anneal by heating said conformal seed layer and said adhesion skin layer at a temperature of from about 100° Celsius to about 400° Celsius for a time period of from about 2 seconds to about 60 minutes;

E. filling said interconnect opening with a conductive material of substantially pure copper grown from said conformal seed layer that is comprised of said pure bulk element;

F. polishing away any of said conductive material, said conformal seed layer, and said adhesion skin layer on said insulating layer surrounding said interconnect opening to expose said insulating layer such that said conductive material is contained within said interconnect opening; and G. depositing a layer of bulk passivation material on said insulating layer and on top of said filled interconnect opening to encapsulate said interconnect opening.

\* \* \* \* \*